United States Patent
Kim et al.

(10) Patent No.: US 8,841,198 B2
(45) Date of Patent: Sep. 23, 2014

(54) ISOLATION LAYER HAVING A BILAYER STRUCTURE FOR A SEMICONDUCTOR DEVICE AND METHOD FOR FORMING THE SAME

(75) Inventors: Hyung Hwan Kim, Gyeonggi-do (KR); Kwang Kee Chae, Gyeonggi-do (KR); Jong Goo Jung, Gyeonggi-do (KR); Ok Min Moon, Gyeonggi-do (KR); Young Bang Lee, Gyeonggi-do (KR); Sung Eun Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1128 days.

(21) Appl. No.: 12/167,322

(22) Filed: Jul. 3, 2008

(65) Prior Publication Data
US 2009/0267199 A1    Oct. 29, 2009

(30) Foreign Application Priority Data
Apr. 29, 2008   (KR) .................. 10-2008-0039940

(51) Int. Cl.
*H01L 21/76*    (2006.01)
*H01L 21/762*   (2006.01)

(52) U.S. Cl.
CPC ............................ *H01L 21/76232* (2013.01)
USPC ...................................................... 438/435

(58) Field of Classification Search
CPC ............... H01L 29/66795; H01L 29/7851; H01L 21/76229
USPC ................. 257/E21.546, E21.551, E21.554; 438/219, 221, 296, 353
See application file for complete search history.

(56) References Cited

U.S. PATENT DOCUMENTS

| | | | | |
|---|---|---|---|---|
| 7,294,575 | B2 * | 11/2007 | Hsu et al. ..................... | 438/692 |
| 2002/0072198 | A1 * | 6/2002 | Ahn ............................. | 438/424 |
| 2003/0013272 | A1 * | 1/2003 | Hong et al. .................. | 438/437 |
| 2007/0020879 | A1 * | 1/2007 | Baek et al. ................... | 438/424 |
| 2007/0148840 | A1 * | 6/2007 | Sheen et al. ................. | 438/197 |
| 2009/0068816 | A1 * | 3/2009 | Eun .............................. | 438/425 |

FOREIGN PATENT DOCUMENTS

KR     1020050002439 A     1/2005

* cited by examiner

*Primary Examiner* — Vongsavanh Sengdara
(74) *Attorney, Agent, or Firm* — Ladas & Parry LLP

(57) ABSTRACT

An isolation layer of a semiconductor device and a process for forming the same is described herein. The isolation layer includes a trench that is defined and formed in a semiconductor substrate. A first liner nitride layer is formed on the surface of the trench and a flowable insulation layer is formed in the trench including the first liner nitride layer. The flowable insulation layer is formed such to define a recess in the trench. A second liner nitride layer is formed on the recess including the flowable insulation layer and the first liner nitride layer. Finally, an insulation layer is formed in the recess on the second liner nitride layer to completely fill the trench.

14 Claims, 6 Drawing Sheets

ISOLATION LAYER HAVING A BILAYER STRUCTURE FOR A SEMICONDUCTOR DEVICE AND METHOD FOR FORMING THE SAME

CROSS-REFERENCE TO RELATED APPLICATIONS

The present application claims priority to Korean patent application number 10-2008-0039940 filed on Apr. 29, 2008, which is incorporated herein by reference in its entirety.

BACKGROUND OF THE INVENTION

The present invention relates to a semiconductor device, and more particularly, to a semiconductor device isolation layer that can prevent defects from occurring in a single SOD (spin-on dielectric) process and a method for forming the same.

As the design for a semiconductor device has decreased, the aspect ratio of trenches of the semiconductor device has increased. As a result, a very fluid insulation material, such as an SOD material, has been used as a material for filling the trenches. For example, PSZ (polysilazane) can be used as the SOD material for forming an isolation layer. PSZ is formed by an Si—N bonding structure and an oxidation reaction must occur after PSZ is applied.

If the oxidation reaction occurs at a low temperature, it is difficult to control the process since a wet etch rate increases excessively in a subsequent wet cleaning process causing a problem. On the contrary, if the oxidation reaction occurs at a high temperature, byproducts such as $NH_3$, $SiH_4$ and $H_2$ are not discharged, but rather coalesce in a layer since the oxidation reaction occurs too quickly causing yet another problem.

In particular, defects in the form of pores are produced by the byproducts coalescing in a layer. During a subsequent wet cleaning process, the pores develop into voids in an isolation layer. The voids can adversely influence a subsequent gate process and can cause bridges between gates and landing plug contacts.

To cope with these problems according to the conventional art, the SOD material is removed to a predetermined depth of the trench through wet etching after filling each trench with the SOD material. A mechanically stable oxide layer, such as an HDP (high density plasma) oxide layer or a USG (undoped silicate glass) oxide layer, is subsequently filled in the trench where the SOD material was partially removed. In this way, an isolation layer having a bilayer structure is formed.

However, as the size of a semiconductor device shrinks below a 50 nm level, the method for forming an isolation layer with a bilayer structure cannot be properly performed because the trench aspect ratio abruptly increases as the semiconductor device shrinks.

SUMMARY OF THE INVENTION

Embodiments of the present invention are directed to an isolation layer of a semiconductor device which can prevent defects from being caused in a single SOD process, and a method for forming the same.

Embodiments of the present invention are also directed to an isolation layer of a semiconductor device which can prevent defects from being caused in a single SOD process, thereby improving the reliability of a semiconductor device and increasing the manufacturing yield, and a method for forming the same.

In one embodiment of the present invention, an isolation layer of a semiconductor device comprises a trench defined in a semiconductor substrate; a first liner nitride layer formed on a surface of the trench; a flowable insulation layer formed in the trench including the first liner nitride layer so that a recess is defined in the trench; a second liner nitride layer formed on the flowable insulation layer and the first liner nitride layer; and an insulation layer formed on the second liner nitride layer to completely fill the trench.

The isolation layer further comprises a sidewall oxide formed between the surface of the trench and the first liner nitride layer.

The isolation layer further comprises a liner oxide layer formed among the flowable insulation layer, the first liner nitride layer and the second liner nitride layer.

The flowable insulation layer is removed from an upper end of the trench by a thickness of 200~2,000 Å, preferably, 500∥1,000 Å.

The second liner nitride layer has a thickness of 30~150 Å.

In another embodiment of the present invention, a method for forming an isolation layer of a semiconductor device comprises the steps of defining a trench in a semiconductor substrate; forming a first liner nitride layer on the semiconductor substrate including a surface of the trench; forming a flowable insulation layer on the first liner nitride layer to fill the trench; removing portions of the flowable insulation layer and the first liner nitride layer which are formed on the semiconductor substrate; removing a partial thickness of the flowable insulation layer; forming a second liner nitride layer on the semiconductor substrate including the flowable insulation layer and the first liner nitride layer; forming an insulation layer on the second liner nitride layer to completely fill the trench; and removing a portion of the insulation layer which is formed on the semiconductor substrate.

After the step of defining the trench and before the step of forming the first liner nitride layer, the method further comprises the step of forming a sidewall oxide on the surface of the trench.

The flowable insulation layer is removed from an upper end of the trench by a thickness of 200~2,000 Å, preferably, 500~1,000 Å.

The step of removing a partial thickness of the flowable insulation layer is conducted through a wet cleaning process.

The step of removing a partial thickness of the flowable insulation layer is conducted through a dry etching process.

After the step of removing a partial thickness of the flowable insulation layer and before the step of forming the second liner nitride layer, the method further comprises the step of forming a liner oxide layer.

The second liner nitride layer is formed to have a thickness of 30~150 Å.

The step of removing the portion of the insulation layer, which is formed on the semiconductor substrate excluding the trench, is conducted through a CMP process.

The CMP process is conducted using a slurry which has a polishing selectivity with respect to a nitride layer, for example, a slurry which contains any one organic polymer among carbonyl, nitril and amide as an additive and $CeO_2$ as a polishing agent.

After the step of removing the portion of the insulation layer which is formed on the semiconductor substrate excluding the trench, the method further comprises the step of removing a portion of the second liner nitride layer which is formed on the semiconductor substrate.

DESCRIPTION OF SPECIFIC EMBODIMENTS

Hereafter, specific embodiments of the present invention will be described in detail with reference to the attached drawings.

Figure 1:
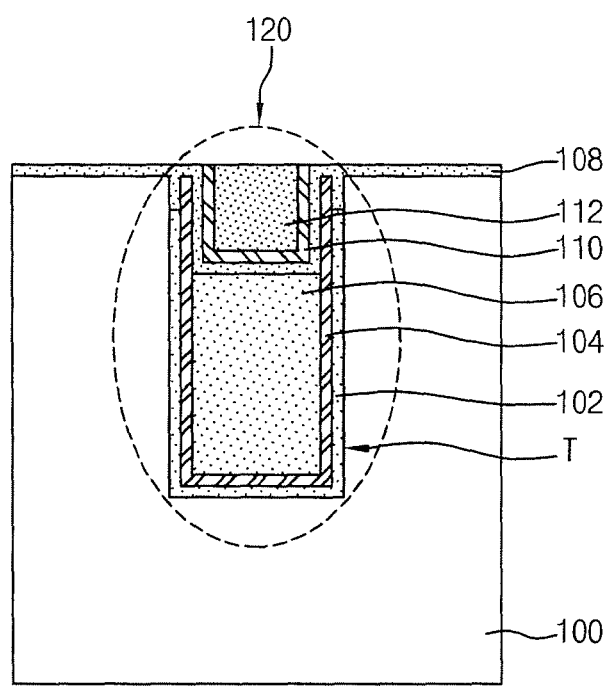
FIG. 1 is a sectional view showing an isolation layer of a semiconductor device in accordance with a first embodiment of the present invention.

FIG. 1 is a sectional view showing an isolation layer of a semiconductor device in accordance with a first embodiment of the present invention.

Referring to FIG. 1, in isolation layer 120 according to a first embodiment of the present invention has a structure comprising a trench T filled with a bilayer. In particular, the isolation layer 120 according to the first embodiment of the present invention has a structure in which a flowable insulation layer, for example, an SOD layer 106, and an ordinary insulation layer 112 are filled in the trench T with a second liner nitride layer 110 interposed between them.

Specifically, a semiconductor substrate 100 having an isolation region is first prepared. The trench T is defined in the isolation region of the semiconductor substrate 100. A sidewall oxide 102 is formed on the surface of the trench T and a first liner nitride layer 104 is formed on the sidewall oxide 102. The SOD layer 106 is formed on the first liner nitride layer 104 to fill the trench T and defining a recess in the trench T. A liner oxide layer 108 is formed on the SOD layer 106 and the first liner nitride layer 104. The second liner nitride layer 110 is subsequently formed on the liner oxide layer 108. The insulation layer 112 is formed on the second liner nitride layer 110 to completely fill the trench T.

Therefore, it is possible to prevent defects, such as voids, from occurring in a single SOD process since the isolation layer according to the first embodiment of the present invention fills the trench and has a bilayer structure. Accordingly, according to the present invention, the reliability of the isolation layer itself can be maintained and the stability of subsequent processes can be ensured. As a result, the reliability and manufacturing yield for a semiconductor device can be both improved and increased.

FIGS. 2A through 2I are sectional views showing the processes of a method for forming an isolation layer of a semiconductor device in accordance with a second embodiment of the present invention. The method will be described below with reference to FIGS. 2A through 2I.

Figure 2A:
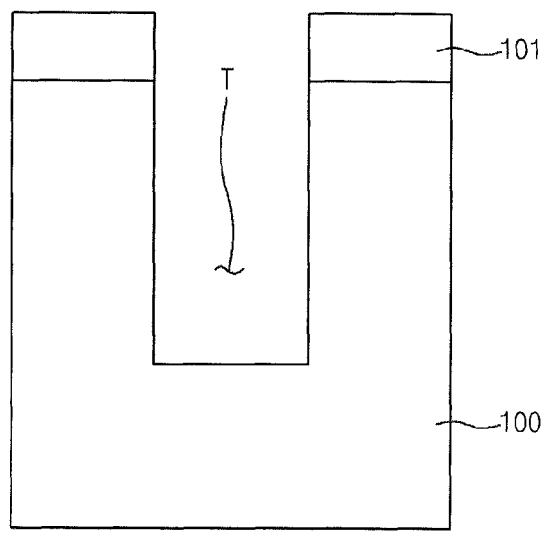
FIGS. 2A through 2I are sectional views showing the processes of a method for forming an isolation layer of a semiconductor device in accordance with a second embodiment of the present invention.

Referring to FIG. 2A, a semiconductor substrate 100 having isolation regions is prepared. A hard mask 101 is formed on the semiconductor substrate 100 to expose each isolation region and a trench T is defined by etching the exposed isolation region of the semiconductor substrate 100. The hard mask is formed of a pad oxide layer and a pad nitride layer as a bilayer.

Figure 2B:
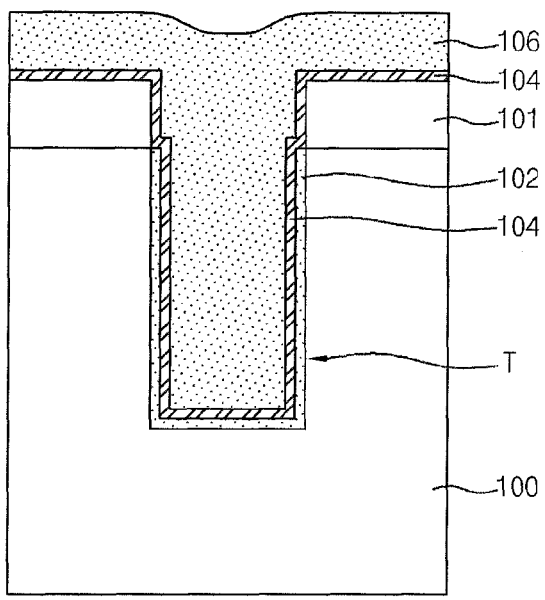
Figure 2C:
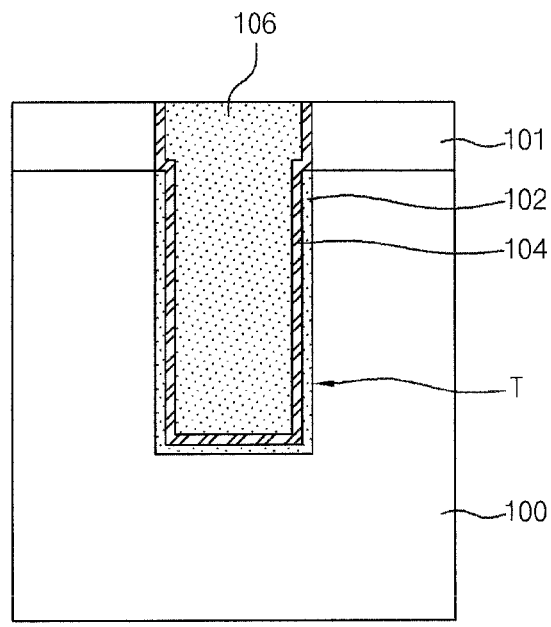
Figure 2D:
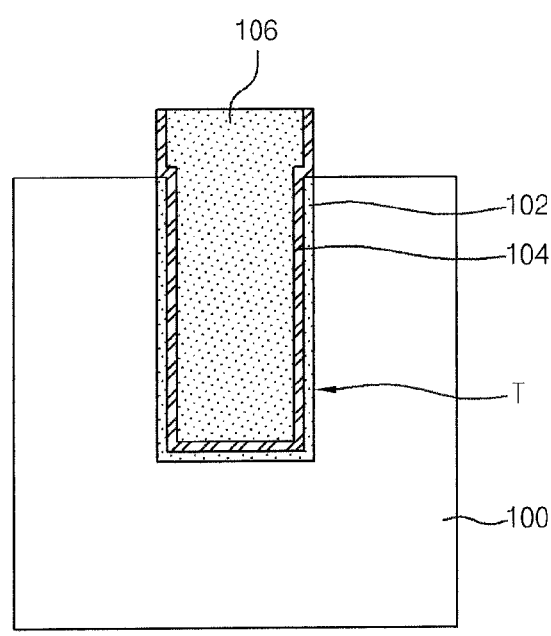

Referring to FIG. 2B, a sidewall oxide 102 is then formed on the surface of the trench T through an oxidation process and a first liner nitride layer 104 is formed on the sidewall oxide 102 and the hard mask 101. Next, a flowable insulation layer, preferably, an SOD layer 106, is deposited on the first liner nitride layer 104 to fill the trench T. Referring to FIG. 2C, the SOD layer 106 and the first liner nitride layer 104 are then removed through a CMP (chemical mechanical polishing) process until the hard mask 101 is exposed. Referring to FIG. 2D, the hard mask is then removed.

Figure 2E:
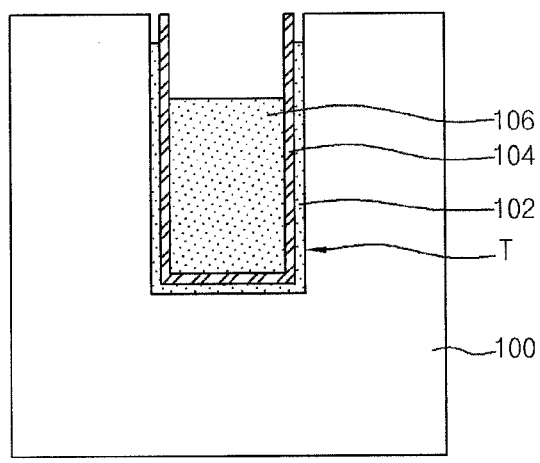

Referring to FIG. 2E, a wet cleaning process is conducted on the resultant semiconductor substrate 100 having the SOD layer 106 filled in the trench T. As a result, a partial thickness of the SOD layer 106 filled in the trench T is removed to define a recess in the trench T. For example, an upper portion of the SOD layer 106 in the range of 200~2,000 Å, preferably, 500~1,000 Å, is removed from the upper end of the trench T. The partial removal of the SOD layer 106 may be conducted via a dry etching process. When the SOD layer 106 is removed, a portion of the sidewall oxide 102 is also removed.

Figure 2F:
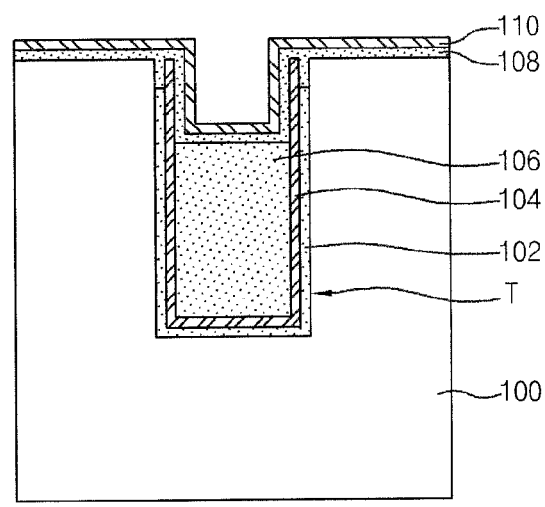

Referring to FIG. 2F, a liner oxide layer 108 is deposited on the semiconductor substrate 100 including the partially removed SOD layer 106 and the first liner nitride layer 104. A second liner nitride layer 110 is deposited on the previously deposited liner oxide layer 108 to a thickness in the range of 30~150 Å. The formation of the liner oxide layer 108 may be omitted.

Figure 2G:
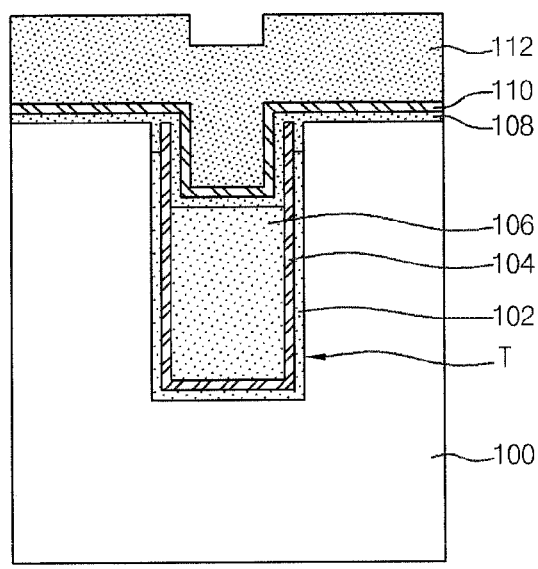

Referring to FIG. 2G, an insulation layer 112 is deposited on the second liner nitride layer 110 to completely fill the trench T. The insulation layer 112 is deposited to a thickness in the range of 300.about.3,000 .ANG. Various insulation materials ordinarily used as materials for forming an interlayer dielectric in semiconductor manufacturing processes can be used for the insulation layer 112.

Figure 2H:
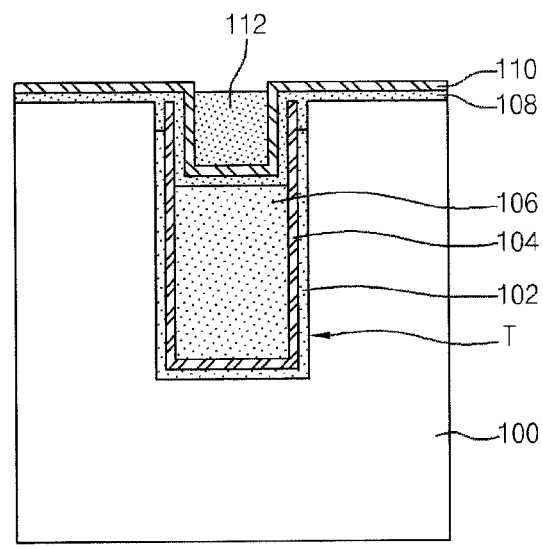

Referring to FIG. 2H, the insulation layer 112 is removed via a CMP process using a slurry, which has a polishing selectivity with respect to a nitride layer, until the second liner nitride layer 110 is exposed. For example, the CMP process is conducted using a slurry that contains an organic polymer such as carbonyl, nitril, or amide as an additive and $CeO_2$ as a polishing agent. This slurry combination is called an HSS (high selectivity slurry).

Figure 2I:
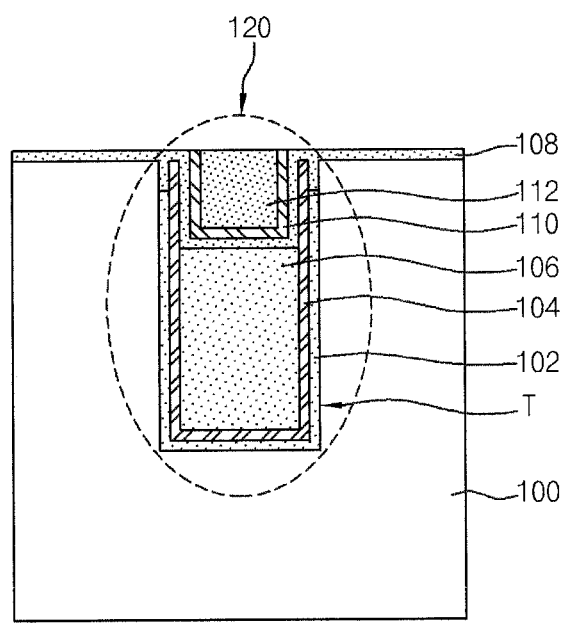

Referring to FIG. 2I, the formation of an isolation layer 120 for defining an active region is completed by removing a portion of the second liner nitride layer 110 on the semiconductor substrate 100, which is exposed due to the removal of the insulation layer 112, through a wet etching process using a phosphoric acid solution or a dry etching process.

The second liner nitride layer may not be removed. In this case, the non-removed portion of the second liner nitride layer can be used as a hard mask material in a subsequent process for recessing the substrate to form recess gates.

As is apparent from the above description, in the present invention, an isolation layer is formed having a bilayer structure. In particular, the bilayer structure is formed by conducting a CMP process immediately before a process for patterning recess gates. Accordingly, in the present invention, it is possible to prevent defects such as voids from occurring in a single SOD process, gates from being poorly patterned, and bridges from being produced between gates and landing plugs. As a result, semiconductor device reliability can be improved and manufacturing yield can be increased. In addition, in the present invention, filing the trenches can be performed stably because the isolation layer having the bilayer structure can be stably formed even though the design of a semiconductor device decreases.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming an isolation layer of a semiconductor device, comprising the steps of:
   forming a hard mask on a semiconductor substrate to expose an isolation region;
   forming a trench by etching the exposed isolation region of the semiconductor substrate;

forming a first liner nitride layer on a surface of the trench and the hard mask;

forming a flowable insulation layer on the first liner nitride layer to fill the trench;

performing a chemical mechanical polishing process to remove a portion of the flowable insulation layer and a portion of the first liner nitride layer until the hard mask is exposed;

removing the hard mask;

removing a partial thickness of the chemical mechanical polished flowable insulation layer to form a recess in the trench;

forming a second liner nitride layer on the partially removed flowable insulation layer, the first liner nitride layer and a surface of the recess;

forming an insulation layer on the second liner nitride layer to completely fill the recess; and removing a portion of the insulation layer formed on the semiconductor substrate and over the trench, wherein the steps are carried out sequentially in the order listed above.

2. The method according to claim 1, wherein, after the step of defining the trench and before the step of forming the first liner nitride layer, the method further comprises the step of:

forming a sidewall oxide on the surface of the trench.

3. The method according to claim 1, wherein in the step of removing a portion of the flowable insulation layer, 200~2,000 Å of the flowable insulation layer is removed from an upper end of the trench.

4. The method according to claim 1, wherein in the step of removing a portion of the flowable insulation layer, 500~1,000 Å of the flowable insulation layer is removed from the upper end of the trench.

5. The method according to claim 1, wherein the step of removing a partial thickness of the flowable insulation layer is conducted using a wet cleaning process.

6. The method according to claim 1, wherein the step of removing a partial thickness of the flowable insulation layer is conducted using a dry etching process.

7. The method according to claim 1, wherein, after the step of removing a partial thickness of the flowable insulation layer and before the step of forming the second liner nitride layer, the method further comprises the step of:

forming a liner oxide layer on the semiconductor substrate, the flowable insulation layer, and the first liner nitride layer.

8. The method according to claim 1, wherein the second liner nitride layer is formed to have a thickness in the range of 30~150 Å.

9. The method according to claim 1, wherein the step of removing the portion of the insulation layer formed on the semiconductor substrate and over the trench is conducted via a chemical mechanical polishing process.

10. The method according to claim 9, wherein the chemical mechanical polishing process is conducted using a slurry having a polishing selectivity with respect to a nitride layer.

11. The method according to claim 10, wherein the chemical mechanical polishing process is conducted using a slurry containing an organic polymer additive being one of carbonyl, nitril and amide, and a $CeO_2$ polishing agent.

12. The method according to claim 1, wherein after the step of removing the portion of the insulation layer formed on the semiconductor substrate excluding the trench, the method further comprises the step of:

removing a portion of the second liner nitride layer formed on the semiconductor substrate.

13. A method for forming an isolation layer of a semiconductor device, comprising the steps of:

forming a hard mask on a semiconductor substrate to expose an isolation region;

forming a trench by etching the exposed isolation region of the semiconductor substrate;

forming a sidewall oxide on a surface of the trench;

forming a first liner nitride layer on the sidewall oxide and the hard mask;

forming a flowable insulation layer on the first liner nitride layer to fill the trench;

removing a portion of the flowable insulation layer and a portion of the first liner nitride layer until the hard mask is exposed;

removing the hard mask;

removing a partial thickness of the flowable insulation layer to form a recess in the trench and an upper portion of the sidewall oxide between the first liner nitride layer and the surface of the trench;

forming a liner oxide layer on the partially removed flowable insulation layer, the first liner nitride layer and a surface of the recess:

forming a second liner nitride layer on the liner oxide layer;

forming an insulation layer on the second liner nitride layer to completely fill the recess; and removing the portion of the insulation layer formed on the semiconductor substrate and over the trench.

14. The method according to claim 13, wherein removing a portion of the flowable insulation layer and a portion of the first liner nitride layer is performed via a chemical mechanical polishing process.

* * * * *